(12) United States Patent
Kim et al.

(10) Patent No.: US 7,811,721 B2
(45) Date of Patent: Oct. 12, 2010

(54) MASK FOR CRYSTALLIZING SILICON, APPARATUS HAVING THE MASK AND METHOD OF CRYSTALLIZING WITH THE MASK

(75) Inventors: Hyun-Dae Kim, Gyeonggi-do (KR); Han-Na Jo, Chungcheongbuk-do (KR)

(73) Assignee: Samsung Electronics Co., Ltd. (KR)

( * ) Notice: Subject to any disclaimer, the term of this patent is extended or adjusted under 35 U.S.C. 154(b) by 894 days.

(21) Appl. No.: 11/639,874

(22) Filed: Dec. 15, 2006

(65) Prior Publication Data
US 2007/0141482 A1 Jun. 21, 2007

(30) Foreign Application Priority Data
Dec. 16, 2005 (KR) ...................... 10-2005-0124634

(51) Int. Cl.
*G03F 1/00* (2006.01)
(52) U.S. Cl. .......................................................... 430/5
(58) Field of Classification Search ...................... 430/5, 430/322, 323, 324; 716/19, 20, 21; 117/200, 117/201, 202
See application file for complete search history.

(56) References Cited

U.S. PATENT DOCUMENTS

2005/0139925 A1* 6/2005 You ........................... 257/351

FOREIGN PATENT DOCUMENTS

CN 1388564 A 1/2003

* cited by examiner

*Primary Examiner*—Stephen Rosasco
(74) *Attorney, Agent, or Firm*—Innovation Counsel LLP

(57) ABSTRACT

A mask for crystallizing silicon includes a first, a second, and a third pattern part arranged in a longitudinal direction, each of the first, second, and third pattern parts including a plurality of unit blocks for transmitting and blocking a portion of light. At least two of the first, second and third pattern parts have a corresponding pattern to each other. Advantageously, scans using the aforementioned mask effectively remove a boundary on the silicon formed by the difference in the amount of laser beam irradiation received by the silicon, thereby improving electronic characteristics of the silicon.

23 Claims, 10 Drawing Sheets

412

414

MASK FOR CRYSTALLIZING SILICON, APPARATUS HAVING THE MASK AND METHOD OF CRYSTALLIZING WITH THE MASK

CROSS-REFERENCE TO RELATED APPLICATIONS

This application claims priority to Korean Patent Application No. 2005-0124634 filed on Dec. 16, 2005, the contents of which are herein incorporated by reference in their entirety.

BACKGROUND

1. Field of the Invention

The present invention relates to a mask for crystallizing silicon and an apparatus having the mask. More particularly, the present invention relates to a mask for crystallizing silicon capable of improving electric characteristics of silicon and an apparatus having the mask.

2. Description of the Related Art

In general, an amorphous silicon thin film transistor (a-Si TFT) has been used as a switching element in a liquid crystal display apparatus. Recently, a poly crystalline silicon thin film transistor (poly-Si TFT) having a higher operation speed has been used for the liquid crystal display apparatus to display an image of a high display quality. Particularly, in an organic light emitting display (OLED) device having an organic light emitting diode that is driven by a current, the poly-Si TFT has been widely used for a switching element, a driving element, etc.

The method of forming a poly crystalline silicon thin film of the poly-Si TFT has included directly forming the poly-Si TFT on a substrate, and forming an amorphous silicon thin film on the substrate and then heating the amorphous silicon thin film to form the poly crystalline silicon thin film, etc. A laser has been generally used for the heating step.

According to the heating method using the laser, a laser beam generated from the laser melts the amorphous silicon thin film on the substrate. The melted silicon is crystallized into a plurality of grains that grows around a plurality of nuclei to form the poly silicon thin film having good crystalline characteristics. Therefore, the amorphous silicon thin film is changed to the poly crystalline silicon thin film that has a higher electric conductivity than the amorphous silicon thin film.

The laser beam generated from the laser may be directly irradiated onto the substrate in one example, or it may be irradiated through a mask in another example. The mask includes a plurality of slits for transmitting the laser beam.

The mask having a small size is transported on the substrate in horizontal and longitudinal directions of the substrate to irradiate the laser beam to an entire surface of the substrate. That is, the mask is transported on the substrate in the longitudinal and horizontal directions at a predetermined distance, and the laser beam is then irradiated onto the substrate so that substantially the entire amorphous silicon thin film of the substrate is changed to a poly crystalline silicon thin film.

However, when the mask is transported to the longitudinal and horizontal directions, a scanning of the laser beam is overlapped with adjacent scanning of the laser beam. That is, a portion of the silicon thin film on the substrate is repeatedly exposed to the laser beam on the substrate. The substrate is divided into a first part where the laser beam is irradiated once, and a second part where the laser beam is repeatedly irradiated. The first part and the second part have different electronic characteristics.

Moreover, when dividing the first part and the second part according to the amount of the irradiation of the laser beam, a structure of the poly silicon thin film on or near a boundary between the first and second parts on the substrate is different from that of a remaining portion of the poly silicon thin film. The boundary deteriorates the electrical characteristics of the poly crystalline silicon thin film, such as electric conductivity.

SUMMARY

The present invention provides an advantageous mask for crystallizing silicon capable of decreasing the disadvantageous effects of a boundary on a poly silicon thin film formed from overlapping irradiation of a laser beam, thereby improving electrical characteristics of the silicon. The present invention also provides an apparatus for crystallizing silicon having the above-mentioned mask.

A mask for crystallizing silicon in accordance with an aspect of the present invention includes a first pattern part, a second pattern part and a third pattern part arranged in a longitudinal direction. At least two of the first, second and third pattern parts have a corresponding pattern to each other.

A plurality of unit blocks is formed on each of the first, second and third pattern parts. The unit blocks transmit a portion of light, and block a portion of the light to crystallize the silicon. The unit blocks may include a plurality of transmission blocks that transmit a portion of the light, and a plurality of blocking blocks that block a portion of the light. Each of the first, second and third pattern parts may include a plurality of sub pattern parts.

A mask for crystallizing silicon in accordance with another aspect of the present invention includes a first pattern part and a second pattern part formed in a longitudinal direction of the mask.

A plurality of unit blocks transmitting a portion of a light and blocking a remaining portion of the light is formed in each of the first and second pattern parts. The first pattern part has an opposite pattern to the second pattern part.

An apparatus for crystallizing silicon in accordance with another aspect of the present invention includes a stage, a laser and a mask. The apparatus for crystallizing silicon may further include a transportation unit and an optical unit.

The stage supports a substrate having amorphous silicon. The laser is formed over the substrate. The laser irradiates a laser beam onto the substrate, and changes the amorphous silicon to poly crystalline silicon. The mask is disposed between the substrate and the laser. The mask transmits a portion of the laser beam irradiated onto the substrate, and blocks a remaining portion of the laser beam. The mask includes a first pattern part, a second pattern part and a third pattern part arranged in a longitudinal direction of the substrate. At least two of the first, second and third pattern parts have a corresponding pattern to each other. Each of the first, second and third pattern parts includes a plurality of unit blocks transmitting a portion of the laser beam and blocking a portion of the laser beam to crystallize the amorphous silicon. The unit blocks are in each of the first, second and third pattern parts.

The transportation unit transports the stage so that the laser beam is irradiated onto substantially the entire substrate. The optical unit is attached to the laser to change optical characteristics of the laser beam.

According to the present invention, at least two of the first, second and third pattern parts include corresponding patterns such that the corresponding patterns of the mask are partially overlapped during adjacent scanning processes thereby overall uniformly irradiating underlying silicon although scanned more than one time. Therefore, the laser beam is uniformly irradiated onto the amorphous silicon thin film so that the boundary between the adjacent scanning processes may have uniform structure, thereby improving electric characteristics of the silicon formed on the substrate.

BRIEF DESCRIPTION OF THE DRAWINGS

The above and other advantages of the present invention will become readily apparent by reference to the following detailed description when considered in conjunction with the accompanying drawings, wherein.

DESCRIPTION OF THE EMBODIMENTS

Figure 1:
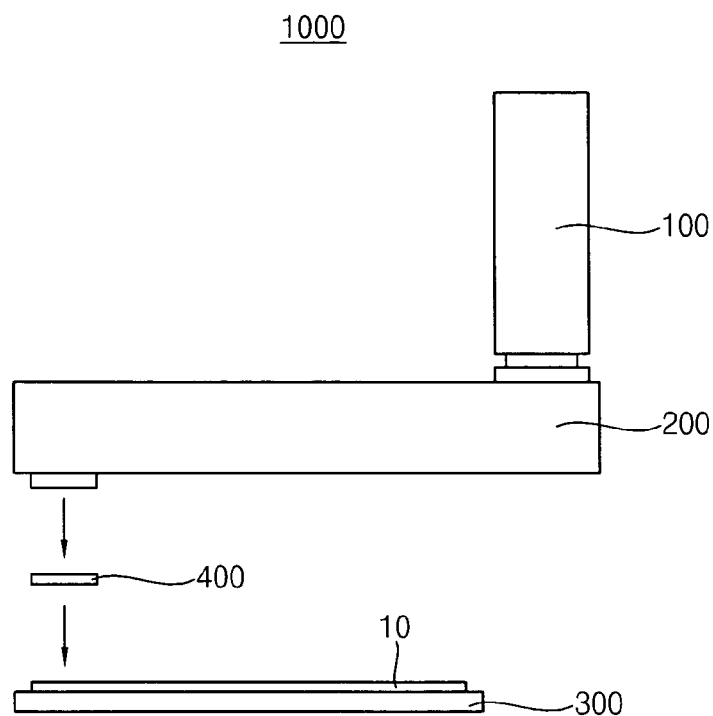
FIG. 1 is a cross-sectional view illustrating an apparatus for crystallizing silicon in accordance with one embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 2:
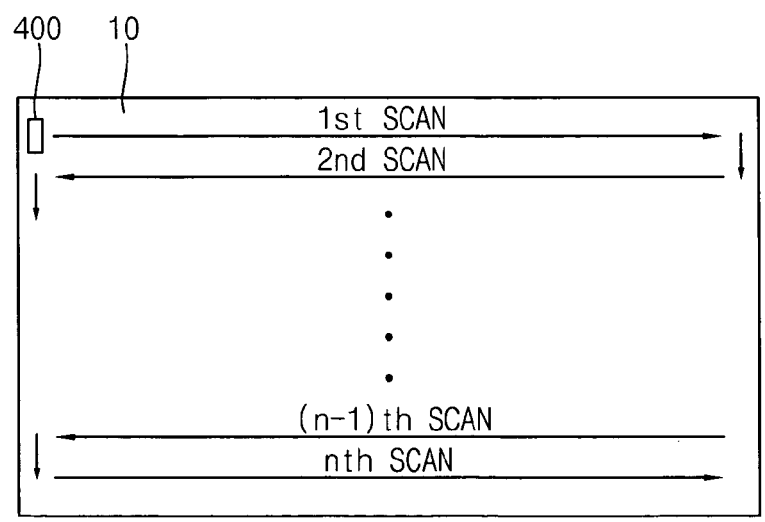
FIG. 2 is a plan view illustrating a process of crystallizing silicon on substantially the entire surface of a substrate by the apparatus of FIG. 1.

FIG. 1 is a cross-sectional view illustrating an apparatus 1000 for crystallizing silicon in accordance with one embodiment of the present invention. FIG. 2 is plan view illustrating a process of crystallizing silicon on substantially the entire surface of a substrate by the apparatus 1000 of FIG. 1.

Referring to FIG. 1, the apparatus 1000 for crystallizing silicon includes a laser 100, an optical unit 200, a stage 300, a mask 400 for crystallizing silicon and a transportation unit.

In one example, the laser 100 continuously generates a laser beam. Alternatively, the laser 100 may intermittently generate the laser beam. The laser 100 may include an excimer laser. The excimer laser generates a laser beam of short wavelength, high power and high efficiency. A wavelength of the laser beam generated by the excimer laser, for example, may be between about 200 nm and about 400 nm, and preferably may be between about 250 nm and about 308 nm. A frequency of the laser beam, for example, may be between about 300 Hz and about 6000 Hz, and preferably may be between about 4000 Hz and about 6000 Hz.

The optical unit 200 is attached to an entrance of the laser 100 generating the laser beam. The optical unit 200 receives the laser beam that is from the laser 100, and changes optical characteristics of the laser beam to emit the laser beam outside of the optical unit 200. For example, the optical unit 200 changes a cross-sectional length or a cross-sectional width of the laser beam. Alternatively, the optical unit 200 may change an intensity of the laser beam.

The stage 300 is disposed under the laser 100, and supports a substrate 10 having amorphous silicon (a-Si). The amorphous silicon (a-Si) is formed as a thin film shape on the substrate 10.

The mask 400 for crystallizing silicon is disposed between the substrate 10 and the laser 100, and transmits a portion of the laser beam and blocks a portion of the laser beam that is irradiated onto the substrate 10. The laser beam is irradiated onto the amorphous silicon (a-Si) formed on the substrate 10, and changes the amorphous silicon (a-Si) to poly crystalline silicon (poly-Si). The mask 400 for crystallizing silicon will be described in detail with reference to following drawings.

A transportation unit transports the stage 300 longitudinally and horizontally so that the laser beam is irradiated onto substantially the entire surface of the substrate 10. The mask 400 for crystallizing silicon is transported longitudinally and horizontally relative to the substrate 10 based on the transportation of the stage 300. Therefore, the laser beam is irradiated onto substantially the entire surface of the substrate 10 through the mask 400.

Referring to FIG. 2, the mask 400 for crystallizing silicon is repeatedly transported between left and right end portions of the substrate 10. Particularly, the mask 400 for crystallizing silicon is transported from the left end portion to the right end portion of the substrate 10 at a first interval IT1 through a first scan. In the first scan, the laser beam is intermittently irradiated onto the substrate 10 through the mask 400 for crystallizing silicon, and the laser beam is also transported from the left end portion to the right end portion of the substrate 10 at the first interval IT1. That is, the stage 300 is intermittently transported from right to left at the first interval IT1 so that the mask 400 and the laser beam are intermittently transported from the left portion to the right portion of the substrate 10 at the first interval IT1. The first interval IT1 at which the mask 400 for crystallizing silicon is transported may be smaller than a width of the mask 400 for crystallizing the silicon.

After the first scan is completed, the mask 400 for crystallizing silicon is shifted at second intervals IT2 in a longitudinal direction that is substantially perpendicular to a scanning direction of the first scan. The second interval IT2 at which the mask 400 for crystallizing silicon is transported, may be smaller than a length of the mask 400 for crystallizing silicon.

The mask 400 is transported from the right end portion to the left end portion of the substrate 10 at the first interval IT1 through a second scan. In the second scan, the laser beam is intermittently irradiated onto the substrate 10 through the mask 400 for crystallizing silicon, and the laser beam is also transported from the right end portion to the left end portion of the substrate 10 at the first interval IT1. That is, the stage 300 is intermittently transported from left to right at the first interval IT1 so that the mask 400 and the laser beam are intermittently transported from the right portion to the left portion of the substrate 10 at the first interval IT1. After the second scan is completed, the mask 400 for crystallizing silicon is shifted at the second interval IT2 in the longitudinal direction substantially perpendicular to a scanning direction of the second scan. The second scan has substantially the same scanning direction as the first scan.

In the same manner as above, the mask 400 for crystallizing silicon is transported between the right end portion and the left end portion N times, thereby completing N scans. The laser beam is irradiated onto substantially the entire surface of the substrate through the mask 400 for crystallizing silicon using the N scans. Therefore, substantially the entire amorphous silicon (a-Si) is changed to poly crystalline silicon (poly-Si).

Figure 3A:
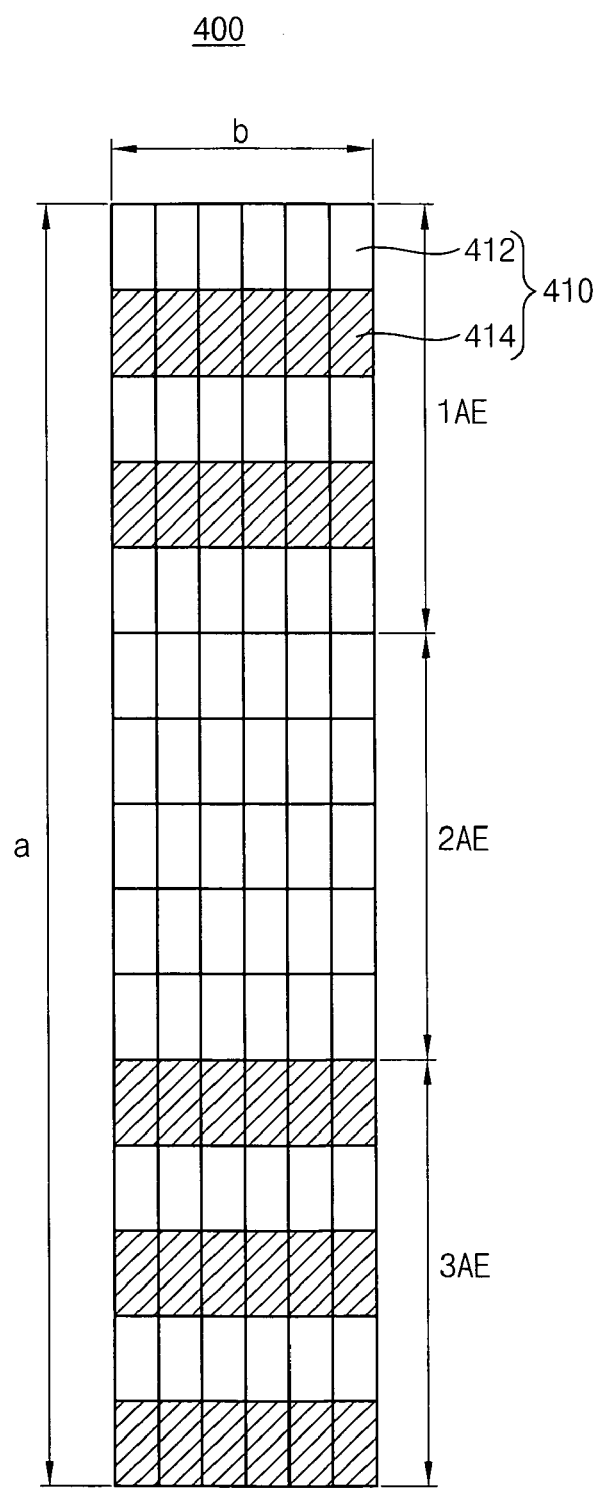
FIGS. 3A to 3C are enlarged plan views illustrating a mask of FIG. 1 for crystallizing silicon.
Figure 3B:
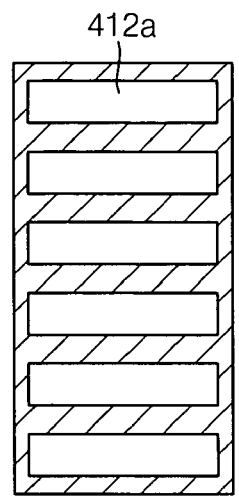
Figure 3C:
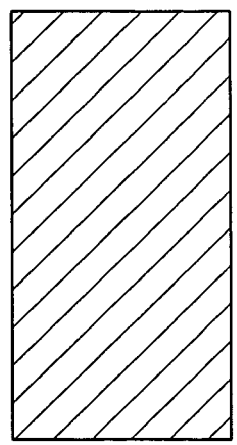
Figure 4:
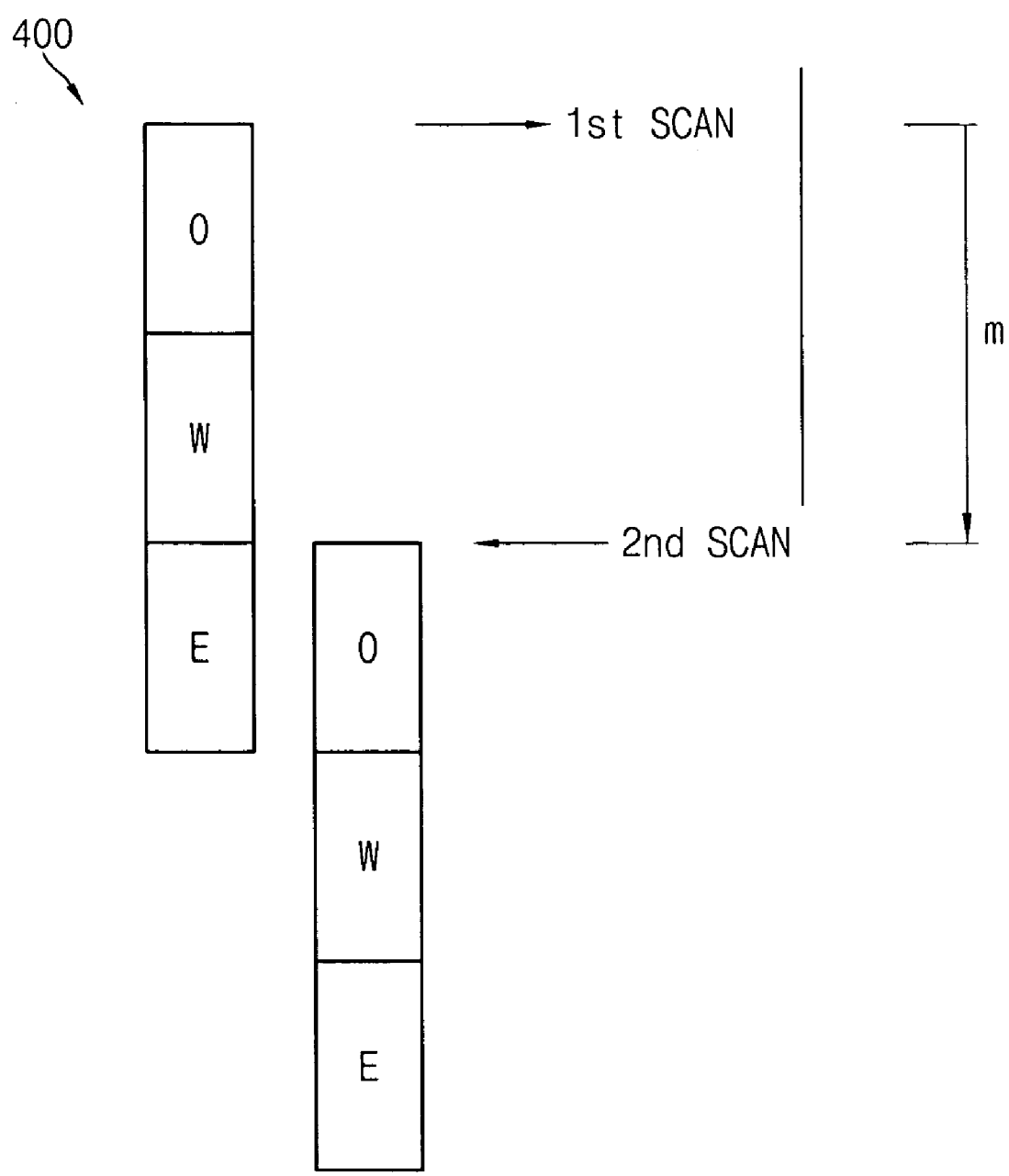
FIG. 4 is a plan view illustrating longitudinal and horizontal transport of the mask of FIG. 3A for crystallizing silicon.

FIGS. 3A to 3C are enlarged plan views illustrating a mask of FIG. 1 for crystallizing silicon. FIG. 4 is a plan view illustrating longitudinal and horizontal transport of the mask of FIG. 3A for crystallizing silicon.

Referring to FIGS. 3A to 3C and 4, the mask 400 includes a first pattern part 1AE, a second pattern part 2AE and a third pattern part 3AE arranged in a longitudinal direction, in sequence. In one example, mask 400 has a length 'a' of about 15 mm, and a width 'b' of about 2 mm.

The unit blocks 410 are formed in the first, second and third pattern parts 1AE, 2AE and 3AE. The unit blocks transmit a portion of the laser beam and block a portion of the laser beam. For example, the mask 400 includes blocks of 15 rows and 6 columns.

The unit block 410 includes a transmission block 412 (shown by a clear block) that transmits a portion of the laser beam, and a blocking block 414 (shown by a hashed block) that blocks a portion of the laser beam. The transmission block 412 includes a plurality of slits 412a that transmits a portion of the laser beam. The slits 412a of the transmission block 412, for example, include a substantially rectangular form, and are arranged in a substantially parallel arrangement in the longitudinal direction.

In one example, a pattern of the transmission and blocking blocks 412, 414 of the first pattern part 1AE is substantially opposite to a pattern of the transmission and blocking blocks 412, 414 of the third pattern part 3AE. The second pattern part 2AE includes only rows and columns of transmission blocks 412 forming a whole transmission part W.

An arrangement of the transmission blocks 412 in the first pattern part 1AE is substantially opposite to an arrangement of the transmission blocks 412 in the third pattern part 3AE so that the patterns of the first pattern part 1AE have a substantially opposite shape to the third pattern part 3AE. In particular, the blocking blocks 414 of the third pattern part 3AE correspond to the transmission blocks 412 of the first pattern part 1AE. The transmission blocks 412 of the third pattern part 3AE correspond to the blocking blocks 414 of the first pattern part 1AE.

For example, the first pattern part 1AE may be an odd row transmission part O. In the odd row transmission part O, the transmission blocks 412 are disposed in odd-numbered rows, and the blocking blocks 414 are disposed in even-numbered rows. In addition, the third pattern part 3AE may be an even row transmission part E. In the even row transmission part E, the transmission blocks 412 are disposed in even-numbered rows, and the blocking blocks 414 are disposed in odd-numbered rows. Alternatively, the first pattern part 1AE may be the even row transmission part E, and the third pattern part 3AE may be the odd roe transmission part O.

Alternatively, the first pattern 1AE may be a progressively increasing transmission part. In the progressively increasing transmission part, the number of the transmission blocks 412 increases gradually in a longitudinal direction from an upper side toward a lower side of the progressively increasing transmission part. In addition, the third pattern part 3AE may be a progressively decreasing transmission part. In the progressively decreasing transmission part, the number of the transmission blocks 412 decreases gradually in a longitudinal direction from an upper side toward a lower side of the progressively decreasing transmission part. Alternatively, the first pattern 1AE may be the progressively decreasing transmission part, and the third pattern 3AE may be the progressive increasing transmission part.

For example, in FIGS. 3A to 3C and 4, the first pattern part 1AE is the odd row transmission part O, and the third pattern part 3AE is the even row transmission part E. Referring to FIG. 4, the mask 400 for crystallizing silicon has the odd row transmission part, the whole transmission part, and the even row transmission part that are arranged, in sequence. The mask for crystallizing silicon is transported from the left end portion to the right end portion of the substrate at first intervals IT1 in the horizontal direction that is substantially perpendicular to the longitudinal direction, thereby performing the first scan.

After the first scan is completed, the mask 400 for crystallizing silicon is shifted in the longitudinal direction by a distance m. The distance m may be the second interval IT2 (shown in FIG. 2) in one example. The distance m may be about two thirds of the length of the mask 400 in one example, and in a further example, the distance m is about 10 mm.

After the shift of the mask 400 along the longitudinal direction of the mask 400, the mask 400 is transported from the left end portion to the right end portion of the substrate at first intervals IT1 in the horizontal direction that is substantially perpendicular to the longitudinal direction, thereby performing the second scan.

In the second scan, the third pattern part 3AE of the first scan is overlapped with the first pattern part 1AE of the second scan (i.e., the first pattern part 1AE overlaps an area of the silicon previously scanned by the third pattern part 3AE). The third pattern part 3AE of the first scan is the even row transmission part E, and the first pattern 1AE of the second scan is the odd row transmission part O, so that the laser beam is uniformly irradiated onto silicon under an overlapped portion of pattern parts between the first and second scans as the overlapped portion provides overall uniform irradiation onto the silicon during the two scans, although the overlapped portion is scanned twice by the first and second scans. During the first scan, a portion of the underlying silicon is irradiated, and during a subsequent scan, a remaining portion of the underlying silicon is irradiated to provide uniform irradiation over the entire surface of the underlying silicon. In other words, the mask of the present invention allows for an overlapped portion of pattern parts between two or more scans to uniformly irradiate over the surface of underlying silicon by using correlated transmission and blocking patterns for selective irradiation, thereby substantially preventing the formation of boundaries caused by non-uniform irradiation over the surface of the silicon.

In the same manner as above, the mask 400 for crystallizing silicon is transported between the left end portion and the right end portion of the substrate so that substantially the entire amorphous silicon (a-Si) formed on the substrate 10 is changed to poly crystalline silicon (poly-Si).

In accordance with the apparatus 1000 and the mask 400 for crystallizing silicon shown in FIGS. 1 to 4, the third pattern part 3AE has a substantially opposite shape to the first pattern part 1AE. The third pattern part 3AE and the first pattern part 1AE are partially overlapped during the adjacent scans that transport mask 400 between the left end portion and the right end portion of the substrate 10. Although the laser beam is scanned two times on the overlapped portion between the adjacent scans, the laser beam is uniformly irradiated onto the substrate 10 effectively one time through the first and third pattern parts 1AE and 3AE that have opposite patterns. Thereby, the poly silicon thin film on a boundary between the overlapped portion and a central portion of each of the scans has substantially the same structure as the polysilicon thin film on the overlapped portion and the central portion of each of the scans, thereby improving the electrical characteristics of the poly crystalline silicon (poly-Si) formed on the substrate 10.

As noted above in one example, the mask 400 for crystallizing silicon may include blocks of fifteen rows and six columns. Alternatively, the mask 400 for crystallizing silicon may include blocks of fifteen rows and eighteen columns.

When the mask 400 for crystallizing silicon includes fifteen rows and eighteen columns, the mask 400 may be divided into six rows, and includes the first, second and third sub masks (not shown). The first, second and third sub masks have corresponding patterns to each other with respect to a central line of the mask 400 for crystallizing silicon.

The transmission blocks 412 transmitting the laser beam may include an upper transmission block and a lower transmission block. Slits of the upper transmission block and slits of the lower transmission block are disposed in different parts in the upper and lower transmission blocks. In order to completely change the amorphous silicon (a-Si) corresponding to each of the unit blocks on the substrate 10, the laser beam may be irradiated twice onto the unit block through the upper transmission block and the lower transmission block. That is, the upper transmission block has a substantially opposite shape to the lower transmission block.

For example, when the mask includes the first, second and third sub masks and one unit block 410 of the first sub mask is the upper transmission block, the unit block 410 of the second sub mask corresponding to the upper transmission block of the first sub mask is one of the lower transmission block and the blocking block 414. In addition, the unit block 410 of the third sub mask corresponding to the upper transmission block of the first sub mask is another of the lower transmission block and the blocking block 414.

The mask 400 for crystallizing silicon having the first, second and third sub masks, is transported repeatedly at a distance that is substantially the same as the width of each of the first, second and third sub masks. The laser beam is then irradiated onto the substrate 10 so that the amorphous silicon (a-Si) corresponding to each of the unit blocks 410 is changed to the poly crystalline silicon.

The apparatus for crystallizing silicon of FIGS. 5A to 5C and 6 is substantially the same as in FIGS. 1 to 4 except for the mask for crystallizing silicon. Thus, the same reference numerals will be used to refer to the same or like parts as those described in FIGS. 1 to 4 and further explanation concerning the above elements will be omitted.

Figure 5A:
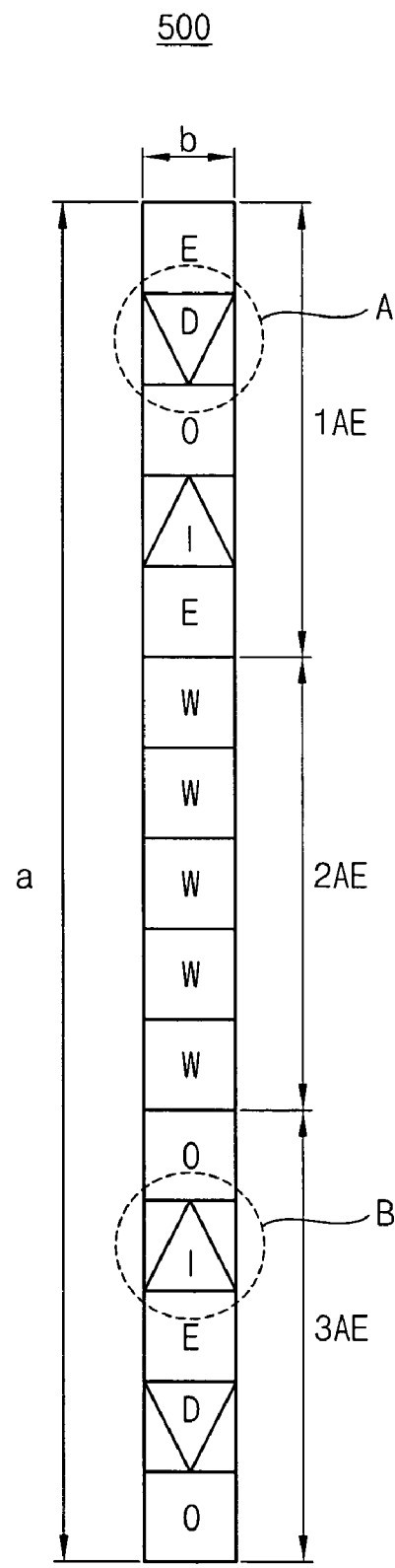
FIGS. 5A to 5C are plan views illustrating a mask of an apparatus for crystallizing silicon in accordance with another embodiment of the present invention.
Figure 5B:
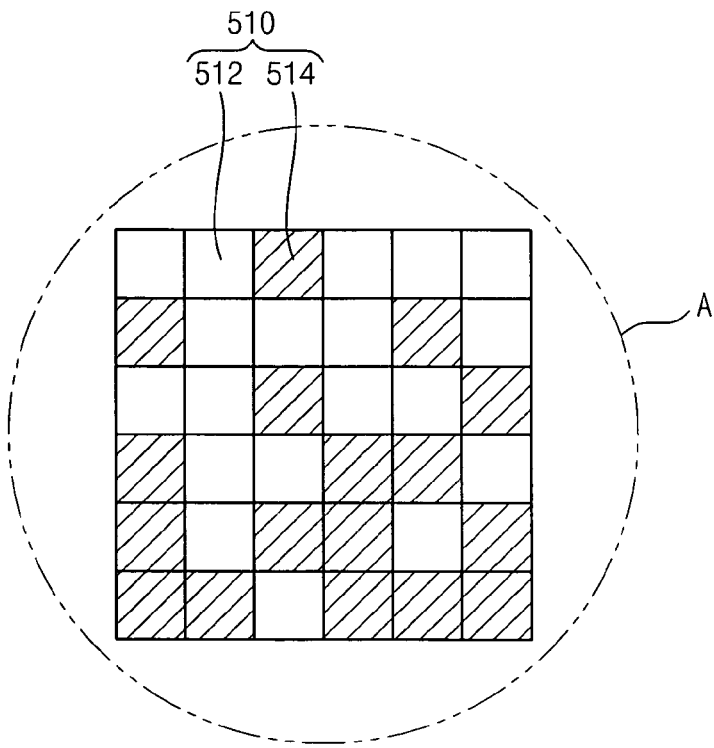
Figure 5C:
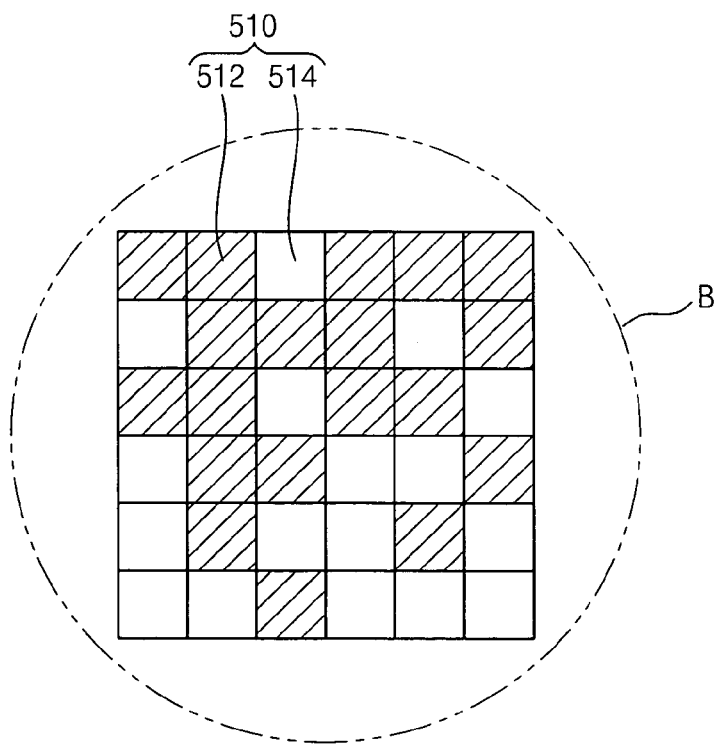
Figure 6:
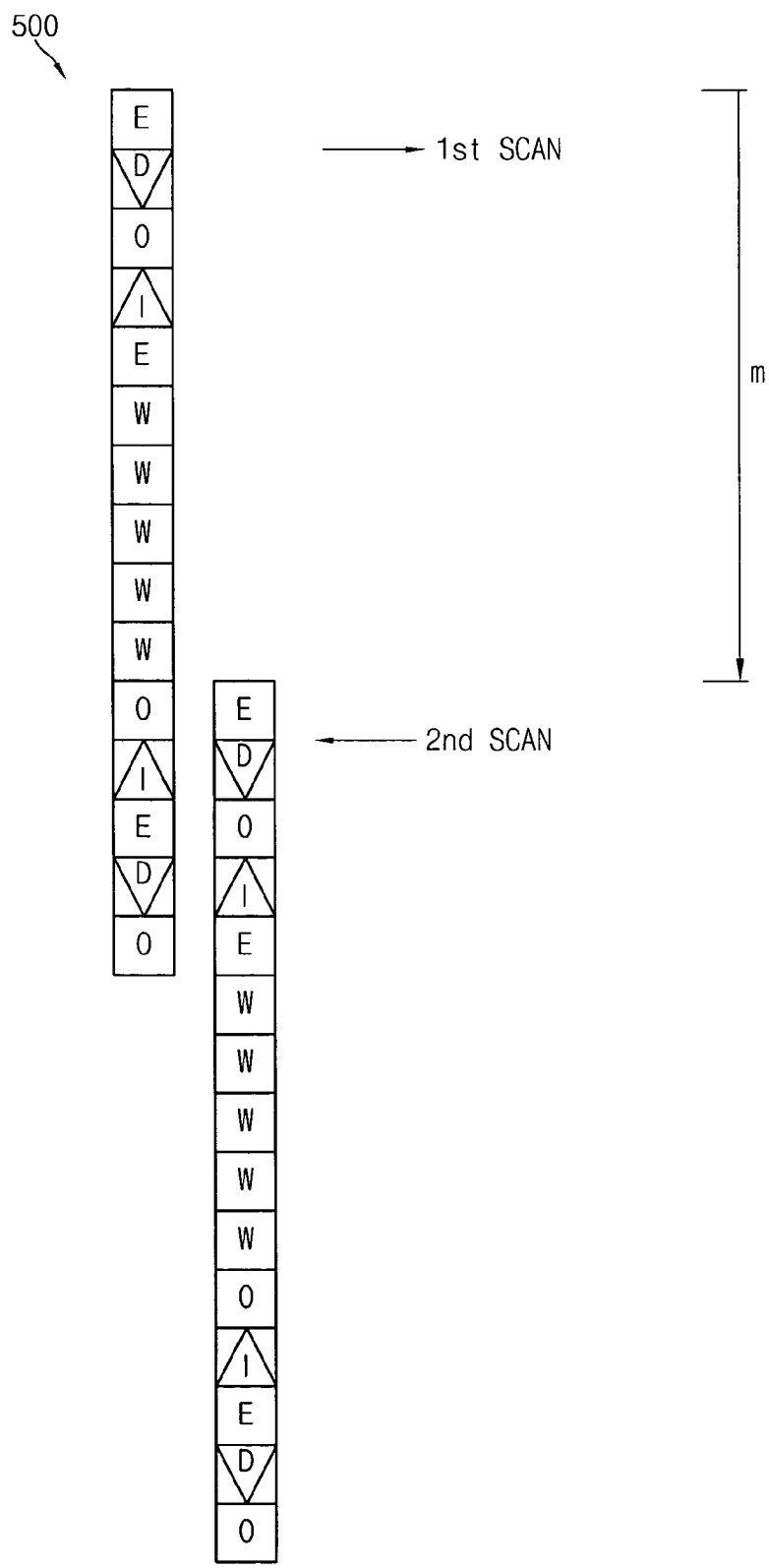
FIG. 6 is a plan view illustrating longitudinal and horizontal transportations of the mask of FIG. 5A.

FIGS. 5A to 5C are plan views illustrating a mask of an apparatus for crystallizing silicon in accordance with another embodiment of the present invention. FIG. 6 is a plan view illustrating longitudinal and horizontal transport of the mask of FIG. 5A.

Referring to FIG. 5, the mask 500 for crystallizing silicon includes a first pattern part 1AE, a second pattern part 2AE and a third pattern part 3AE. The first, second and third pattern parts 1AE, 2AE and 3AE may be aligned in a longitudinal direction of the mask 500 for crystallizing silicon. Each of the first, second and third pattern parts 1AE, 2AE and 3AE includes a plurality of sub pattern parts. For example, each of the first, second and third pattern parts 1AE, 2AE and 3AE include five sub pattern parts. In a further example, a length 'a' of the mask 500 for crystallizing the silicon may be about 25 mm, and a width 'b' of the mask 500 for crystallizing the silicon may be about 1.2 mm.

A plurality of unit blocks 510 transmits a portion of a laser beam, and blocks a remaining portion of the laser beam. The unit blocks 510 are formed in each sub pattern part of the first, second and third pattern parts 1AE, 2AE and 3AE. The unit blocks 510 include a transmission block 512 that transmits a portion of the laser beam, and a blocking block 514 that blocks a portion of the laser beam.

A pattern of the sub pattern parts of the first pattern part 1AE has a substantially opposite shape to a pattern of the sub pattern parts of the third pattern part 3AE. The sub pattern parts of the second pattern part 2AE include a whole transmission part W. The first pattern part 1AE and the third pattern part 3AE may have a substantially symmetric structure with respect to the second pattern part 2AE.

Particularly, the sub pattern parts in the first pattern part 1AE may include an odd row transmission part O, an even row transmission part E, a progressively increasing transmission part I, a progressively decreasing transmission part D, the whole transmission part W, and a whole blocking part (not shown). The sub pattern parts in the third pattern part 3AE include the opposite configuration of the sub pattern parts of the first pattern part 1AE.

In the odd row transmission part O, the transmission blocks 512 are disposed in odd-numbered rows, and the blocking blocks 514 are disposed in even-numbered rows. In the even row transmission part E, the transmission blocks 512 are disposed in even-numbered rows and the blocking blocks 514 are disposed in odd-numbered rows.

In the progressively increasing transmission part I, the number of the transmission blocks 512 increases gradually in the longitudinal direction from an upper side toward a lower side of the progressively increasing transmission part. In the progressively decreasing transmission part D, the number of the transmission blocks 512 decreases gradually in the longitudinal direction from an upper side toward a lower side of the progressively decreasing transmission part.

Entire columns and rows of the whole transmission part W include the transmission blocks 512, and the entire whole blocking part (not shown) includes the blocking blocks 514.

Particularly, the sub pattern parts in the first pattern part 1AE have the even row transmission part E, the progressively decreasing transmission part D, the odd row transmission part O, the progressively increasing transmission part I, and the even row transmission part E that are arranged, in sequence. The sub pattern parts in the third pattern part 3AE have an opposite arrangement to the sub pattern parts in the first pattern part 1AE, so that the sub pattern parts in the third pattern part 3AE have the odd row transmission part O, the progressively increasing transmission part I, the even row transmission part E, the progressively decreasing transmission part D, and the odd row transmission part O that are arranged in sequence.

The mask 500 for crystallizing the silicon has the arrangement shown in FIG. 5A. Alternatively, the mask 500 for crystallizing silicon may have various arrangements, including in one example, mirror opposite sub pattern parts in the first pattern part 1AE and the third pattern part 3AE.

Referring to FIG. 6, the mask 500 for crystallizing the silicon is transported from a left end portion to a right end portion of the substrate at a first interval IT1 in a direction substantially perpendicular to the longitudinal direction of the mask 500 through a first scan. The mask 500 is shifted in the longitudinal direction at a distance m in one example. The distance m of the mask 500 may be about two thirds of a longitudinal length of the mask 500 in one example.

After the shift of the mask 500 along the longitudinal direction of the mask 500, the mask 500 is transported from the right end portion to the left end portion of the substrate at a second interval IT2 in a direction substantially perpendicular to the longitudinal direction, thereby performing the second scan.

In the second scan, the third pattern part 3AE of the first scan is overlapped with the first pattern part 1AE of the second scan. A pattern arrangement of the third pattern part 3AE of the first scan is opposite to a pattern arrangement of the first pattern part 1AE of the second scan, so that the laser beam is uniformly irradiated onto silicon under an overlapped portion between the first and second scans effectively one time, although the overlapped portion is scanned twice by the first and second scans.

In the same manner as above, the mask 500 for crystallizing silicon is transported between the left end portion and the right end portion of the substrate so that substantially the entire amorphous silicon (a-Si) formed on the substrate 10 is changed into poly crystalline silicon (poly-Si).

Hereinafter, the apparatus of FIGS. 5A to 5C and 6 will be described in comparison to the apparatus in FIGS. 1 to 4.

In FIGS. 1 to 4, when a length of a mask 400 for crystallizing silicon is increased, a third pattern part 3AE has an opposite pattern arrangement to a first pattern part 1AE. Each of the first, second and third pattern parts 1AE, 2AE and 3AE has a simple pattern, so that the first, second and third pattern parts 1AE, 2AE and 3AE may be recognized as different scans. That is, the pattern parts 1AE, 2AE and 3AE may be recognized as different scans, even though the third pattern part 3AE and the first pattern part 1AE are overlapped with each other and are transported between the left end portion to the right end portion of the substrate. When the first, second and third pattern parts 1AE, 2AE and 3AE are recognized as different scans, a boundary may be formed between the first, second and third pattern parts 1AE, 2AE and 3AE.

In contrast, each the first, second and third pattern parts 1AE, 2AE and 3AE of the mask 500 for crystallizing silicon is divided into a plurality of sub pattern parts. The divided sub pattern parts may include the odd row transmission part O, the even row transmission part E, the progressively increasing transmission part I, the progressively decreasing transmission part D, the whole transmission part W, and the whole blocking part (not shown).

When a pattern arrangement of the first pattern part 1AE is opposite to a pattern arrangement of the third pattern part 3AE, and the first pattern part 1AE and the third pattern part 3AE have complex patterns, the first, second and third pattern parts 1AE, 2AE and 3AE may not be recognized as different scans, and the boundary may not be recognized.

The apparatus for crystallizing silicon of FIGS. 7A to 7C and 8 is substantially the same as in FIGS. 1 to 4 except for the mask for crystallizing silicon. Thus, the same reference numerals will be used to refer to the same or like parts as those described with respect to FIGS. 1 to 4 and further explanation concerning the above elements will be omitted.

Figure 7A:
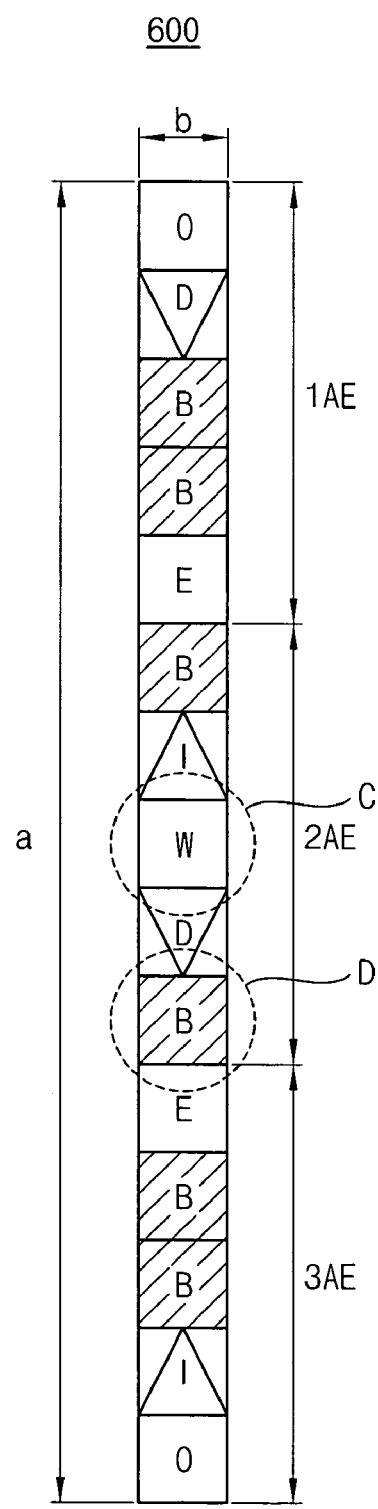
FIGS. 7A to 7C are plan views illustrating a mask of an apparatus for crystallizing silicon in accordance with another embodiment of the present invention.
Figure 7B:
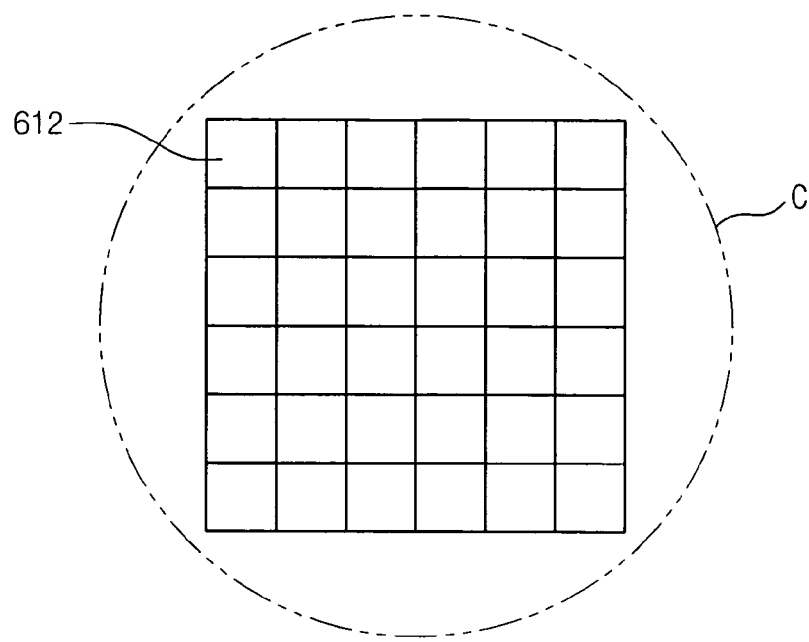
Figure 7C:
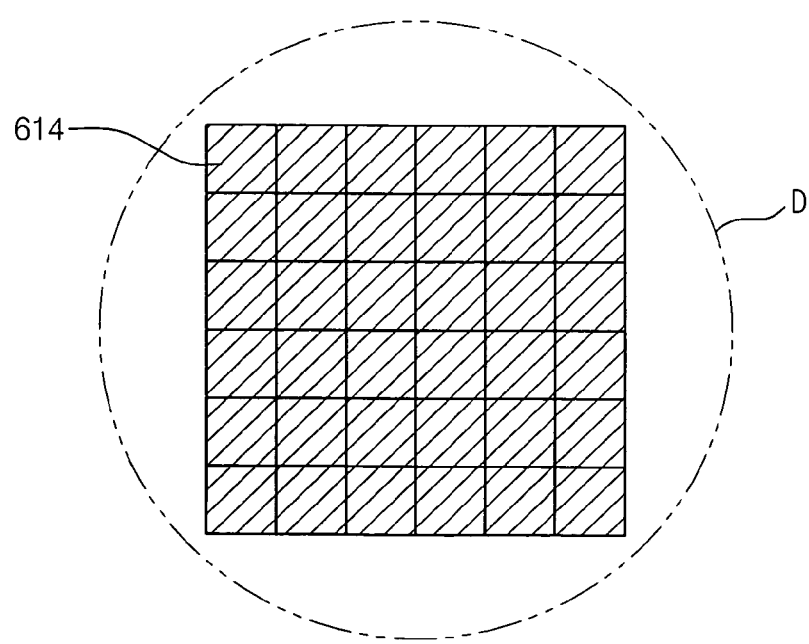
Figure 8:
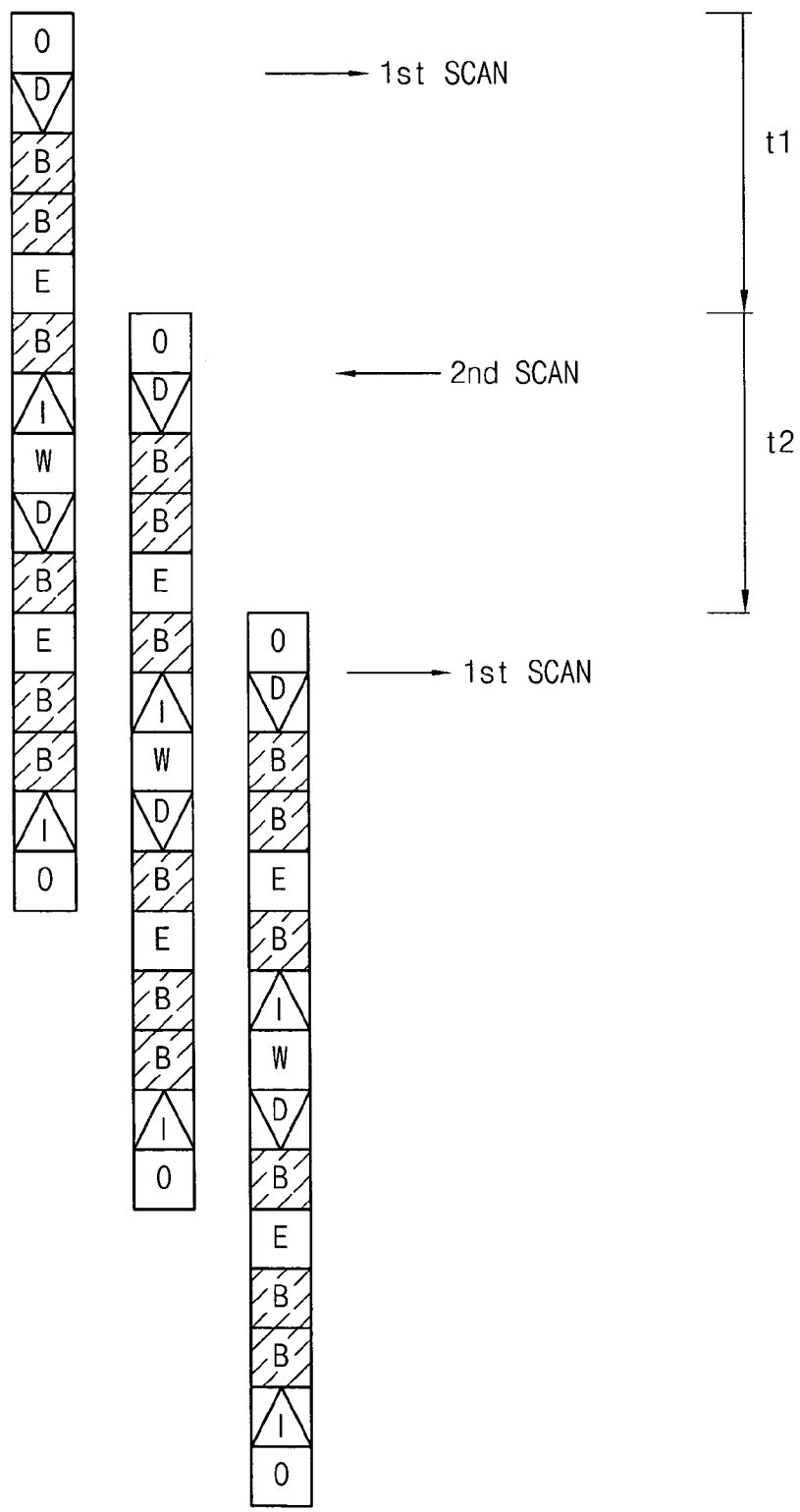
FIG. 8 is a plan view showing longitudinal and horizontal transport of the mask of FIG. 7A.

FIGS. 7A to 7C are plan views illustrating a mask of an apparatus for crystallizing silicon in accordance with another embodiment of the present invention. FIG. 8 is a plan view illustrating longitudinal and horizontal transport of the mask of FIG. 7A.

Referring to FIGS. 7A to 7C, the mask 600 for crystallizing silicon includes a first pattern part 1AE, a second pattern part 2AE and a third pattern part 3AE. The first, second and third pattern parts 1AE, 2AE and 3AE may be aligned in a longitudinal direction of the mask 600 for crystallizing silicon. Each of the first, second and third pattern parts 1AE, 2AE and 3AE includes a plurality of sub pattern parts. For example, each of the first, the second and the third pattern parts 1AE, 2AE and 3AE may include five sub pattern parts. In the divided mask 600 for crystallizing silicon, a length 'a' of the mask 600 for crystallizing silicon may be about 25 mm, and a width 'b' of the mask 600 for crystallizing silicon may be about 1.2 mm.

A plurality of unit blocks 610 that transmits a portion of a laser beam and blocks a portion of the laser beam, are formed in each sub pattern part of the first, second and third pattern parts 1AE, 2AE and 3AE. The unit blocks 610 include a transmission block 612 that transmits a portion of the laser beam, and the blocking block 614 that blocks a portion of the laser beam.

The first, second and third pattern parts 1AE, 2AE and 3AE have corresponding patterns to each other. Thus, the laser beam is uniformly irradiated onto silicon under an overlapped portion between the first and second scans effectively one time, although the overlapped portion is scanned twice by the first and second scans. The first, second and third pattern parts 1AE, 2AE and 3AE may have a substantially symmetric structure (e.g., a mirror image) with respect to a center of the sub pattern parts of the second pattern part 2AE.

Particularly, when an n-th sub pattern part in one sub pattern part of the first, second and third pattern parts 1AE, 2AE and 3AE is the odd row transmission part O, an n-th sub pattern part in another sub pattern part of the first, second and third pattern parts 1AE, 2AE and 3AE is one of the even row transmission part E and the whole blocking part (not shown), and an n-th sub pattern part in a remaining sub pattern part of the first, second and third pattern parts 1AE, 2AE and 3AE is the other one of the even row transmission part E and the whole blocking part (not shown).

Additionally, when the n-th sub pattern part in one sub pattern part of the first, second and third pattern parts 1AE, 2AE and 3AE is the progressively increasing transmission part I, the n-th sub pattern part in another sub pattern part of the first, second and third pattern parts 1AE, 2AE and 3AE is one of the progressively decreasing transmission part D and the whole blocking part B, and the n-th sub pattern part in a remaining sub pattern part of the first, second and third pattern parts 1AE, 2AE and 3AE is the other one of the progressively decreasing transmission part D and the whole blocking part B.

Furthermore, when the n-th sub pattern part in one sub pattern part of the first, second and third pattern parts 1AE, 2AE and 3AE is the whole transmission part W, the n-th sub pattern part in another sub pattern part of the first, second and third pattern parts 1AE, 2AE and 3AE is the whole blocking part B, and the n-th sub pattern part in a remaining sub pattern part of the first, second and third pattern parts 1AE, 2AE and 3AE is the whole blocking part B.

Particularly, the sub pattern parts in the first pattern part 1AE include the odd row transmission part O, the progressively decreasing transmission part D, the whole blocking part B, the whole blocking part B, and the even row transmission part E that are arranged, in sequence. The sub pattern parts in the second pattern part 2AE include the whole blocking part B, the progressively increasing transmission part I, the whole transmission part W, the progressively decreasing transmission part D, and the whole blocking part B that are arranged, in sequence. The sub pattern parts in the third pattern part 3AE include the even row transmission part E, the whole blocking part B, the whole blocking part B, the progressively increasing transmission part I, the odd row transmission part O that are arranged, in sequence.

The mask 600 for crystallizing the silicon has the arrangement shown in FIGS. 7A to 7C and 8. Alternatively, the mask 600 for crystallizing silicon having the corresponding patterns to each other in the first, second and third pattern parts 1AE, 2AE and 3AE may have various arrangements.

In FIGS. 7A to 7C and 8, the whole transmission part W and the whole blocking part B may not be disposed next to each other, and the odd row transmission part O and the even row transmission part E may not be disposed next to each other. In addition, the progressively increasing transmission part I and the progressively decreasing transmission part D may not be disposed next to each other.

Referring to FIG. 8, the mask 600 for crystallizing silicon is transported from a left end portion to a right end portion of the substrate at a first interval IT1 in a direction substantially in perpendicular to the longitudinal direction of the mask 600 through a first scan. After the first scan is completed, the mask 600 is shifted in the longitudinal direction at a distance t1. The distance t1 may be about one third of the length of the mask 600 in one example.

After the shift of the mask 600 along the longitudinal direction of the mask 600 for crystallizing silicon, the mask 600 is transported from the right end portions to the left end portion of the substrate at a second interval IT2 in a direction substantially perpendicular to the longitudinal direction, thereby performing the second scan. After the second scan is completed, the mask 600 for crystallizing the silicon is shifted along the longitudinal direction at a distance t2. The distance t2 may also be one third of the length of the mask 600 in one example.

Then, the mask for crystallizing silicon is transported from the left end portion to the right end portion of the substrate at a third interval IT3 in a direction substantially perpendicular to the longitudinal direction, thereby performing the third scan.

In the third scan, the third pattern part 3AE of the first scan, the second pattern part 2AE of the second scan and the first pattern part 1AE of the third scan are overlapped with each other.

The third pattern part 3AE of the first scan, the second pattern part 2AE of the second scan and the third pattern part 3AE of the third scan have the corresponding patterns to each other, so that the laser beam is uniformly irradiated onto silicon under an overlapped portion between the first, second and third scans effectively one time, although the overlapped portion is scanned three times by the first, second and third scans.

In the same manner as above, the mask 600 for crystallizing silicon is transported between the left end portion and the right end portion of the substrate so that substantially the entire amorphous silicon (a-Si) formed on the substrate 10 is changed into poly crystalline silicon (poly-Si).

Hereinafter, the apparatus of FIGS. 7A to 7C and 8 will be described in comparison with the apparatus in FIGS. 1 to 4.

The mask 600 for crystallizing silicon includes the first, second and third pattern parts 1AE, 2AE and 3AE. Each of the first, second and third pattern parts 1AE, 2AE and 3AE is divided into a plurality of sub pattern parts.

In FIGS. 5A to 5C and 6, the first pattern part 1AE and the third pattern part 3AE have opposite patterns to each other, and an entirety of the second pattern part 2AE includes the whole transmission part W. In contrast, in FIGS. 7A to 7C and 8, the first, second and third pattern parts 1AE, 2AE and 3AE have corresponding patterns to each other.

That is, the entirety of the second pattern part 2AE of FIGS. 5A to 5C and 6 is the whole transmission part W, but the second pattern part 2AE of FIGS. 7A to 7C and 8 has the corresponding pattern to the first and third pattern parts 1AE and 3AE. Therefore, the laser beam is irradiated onto silicon under an overlapped portion between the first, second and third scans effectively one time, although the overlapped portion is scanned three times by the first, second and third scans.

Therefore, the first, second and third pattern parts 1AE, 2AE and 3AE of FIGS. 7A to 7C and 8 have more complex patterns than the first, second and third pattern parts 1AE, 2AE and 3AE of FIGS. 5A to 5C and 6, so that the first, second and third pattern parts 1AE, 2AE and 3AE may not be recognized as different scans, and a boundary formed by the first, second and third scans may not be recognized.

According to the present invention, the first pattern part has an opposite pattern to the third pattern part in one example. The first pattern part and the third pattern part are overlapped with each other, and are transported between the left end portion and the right end portion of the substrate. Thus, the laser beam is irradiated onto silicon under the overlapped portion between the first and second scans effectively one time, although the overlapped portion is scanned two times by the first and second scans. Therefore, the boundary formed by the difference in the amount of laser beam irradiation received on the silicon may be reduced, and the electronic characteristics of the poly crystalline silicon (poly-Si) are improved.

Moreover, each of the first, second and third pattern parts includes a plurality of sub pattern parts. The first pattern part has opposite pattern arrangement to the third pattern part, or the first, second and third pattern parts may have the corresponding patterns to each other. Thereby, the first, second and third pattern parts may not be recognized as different scans so that the boundary formed by the scans may be removed.

Although embodiments of the present invention have been described, it is understood that the present invention should not be limited to these embodiments but various changes and modifications can be made by one of ordinary skill in the art within the spirit and scope of the present invention as hereinafter claimed.

What is claimed is:

1. A mask, comprising:
    a first pattern part, a second pattern part, and a third pattern part arranged in a longitudinal direction, each of the first, second, and third pattern parts including a plurality of unit blocks transmitting a portion of light and blocking a portion of the light to selectively crystallize silicon,
    wherein the first pattern part and the third pattern part comprise a substantially symmetric structure with respect to the second pattern part.

2. The mask of claim 1, wherein the unit blocks comprise a plurality of transmission blocks transmitting a portion of light, and a plurality of blocking blocks blocking a portion of the light.

3. The mask of claim 2, wherein each of the transmission blocks comprises a plurality of slits.

4. The mask of claim 2, wherein each of the first, second, and third pattern parts comprises a plurality of sub pattern parts,
    and wherein each of the sub pattern parts is one of:
    an odd row transmission sub pattern part including transmission blocks in odd-numbered rows and blocking blocks in even-numbered rows;
    an even row transmission sub pattern part including transmission blocks in even-numbered rows and blocking blocks in odd-numbered rows;
    a transmission increasing sub pattern part, wherein the number of transmission blocks is increased as a distance from a side of the mask in the longitudinal direction is increased;
    a transmission decreasing sub pattern part, wherein the number of transmission blocks is decreased as a distance from a side of the mask in the longitudinal direction is increased;
    a whole transmission sub pattern part including only transmission blocks; and
    a whole blocking sub pattern part including only blocking blocks.

5. The mask of claim 4, wherein the sub pattern parts of the first pattern part comprise a combination of at least one of the odd row transmission sub pattern part, the even row transmission sub pattern part, the transmission increasing sub pattern part, the transmission decreasing sub pattern part, the whole transmission sub pattern part, and the whole blocking sub pattern part,
    and wherein the sub pattern parts of the third pattern part comprise a combination of at least one of the even row transmission sub pattern part, the odd row transmission sub pattern part, the transmission decreasing sub pattern part, the transmission increasing part, the whole blocking sub pattern part, and the whole transmission sub pattern part, wherein the combination of the sub pattern parts of the third pattern part is opposite to the combination of the sub pattern parts of the first pattern part.

6. The mask of claim 4, wherein the first, second, and third pattern parts comprise a substantially symmetric structure with respect to a center of the first, second, and third pattern parts in the longitudinal direction.

7. The mask of claim 4, wherein an n-th sub pattern part of one of the first, second, and third pattern parts is an odd row transmission sub pattern part,
    and wherein an n-th sub pattern part of another of the first, second, and third pattern parts is one of an even row transmission sub pattern part and a whole blocking sub pattern part,
    and wherein the n-th sub pattern part of a remaining of the first, second, and third pattern parts is a remainder of the even row transmission sub pattern part and the whole blocking sub pattern part.

8. The mask of claim 4, wherein an n-th sub pattern part of one of the first, second, and third pattern parts is a transmission increasing sub pattern part,
    further wherein an n-th sub pattern part of another of the first, second and third pattern parts is one of the transmission decreasing sub pattern part and the whole blocking sub pattern part, and
    further wherein an n-th sub pattern part of a remaining of the first, second and third pattern parts is a remainder of the transmission decreasing sub pattern part and the whole blocking sub pattern part.

9. The mask of claim 4, when wherein an n-th sub pattern part of one of the first, second and third pattern parts is the whole transmission sub pattern part,
    further wherein an n-th sub pattern part of another of the first, second and third pattern parts is the whole blocking sub pattern part, and
    further wherein an n-th sub pattern part of a remaining of the first, second and third pattern parts is the whole blocking sub pattern part.

10. The mask of claim 4, wherein each of the first, second and third pattern parts comprises five sub pattern parts,
    and wherein the sub pattern parts of the first pattern part includes the odd row transmission sub pattern part, the transmission decreasing sub pattern part, the whole blocking sub pattern part, the whole blocking sub pattern part, and the even row transmission sub pattern part, in sequence, and wherein the sub pattern parts of the second pattern part includes the whole transmission sub pattern part, the transmission increasing sub pattern part, the whole transmission sub pattern part, the transmission decreasing sub pattern part, and the whole blocking sub pattern part, in sequence, and wherein the sub pattern parts of the third pattern part includes the even row transmission sub pattern part, the whole blocking sub pattern part, the whole blocking sub pattern part, the transmission increasing sub pattern part, and the odd row transmission sub pattern part, in sequence.

11. A mask, comprising:

a first pattern part and a second pattern part formed in a longitudinal direction, each of the first and second pattern parts including a plurality of unit blocks transmitting a portion of light and blocking a portion of the light to selectively crystallize silicon, the first pattern part having an opposite pattern to the second pattern part such that silicon under an overlapped portion of the first pattern part and the second pattern part is uniformly irradiated.

12. The mask of claim 11, wherein the first and second pattern parts comprise a substantially symmetric structure with respect to a center of the first and second pattern parts in the longitudinal direction.

13. The mask of claim 11, wherein the unit block comprises a transmission block transmitting a portion of light, and a blocking block blocking a remaining portion of the light.

14. The mask of claim 11, wherein one of the first and second pattern parts comprises a plurality of rows, the transmission blocks being on odd-numbered rows and the blocking blocks being on even-numbered rows, and wherein another of the first and second pattern parts comprises a plurality of rows, the blocking blocks being on odd-numbered rows and the transmission blocks being on even-numbered rows.

15. The mask of claim 11, wherein the number of the transmission blocks of one of the first and second pattern parts is increased as a distance from the second pattern part in the longitudinal direction is increased, and wherein the number of the transmission blocks of another of the first and second pattern parts is decreased as a distance from the second pattern part in the longitudinal direction is increased.

16. The mask of claim 11, wherein each of the first and second pattern parts comprises a plurality of sub pattern parts, wherein each of the sub pattern parts is one of:

an odd row transmission sub pattern part including transmission blocks in odd-numbered rows and blocking blocks in even-numbered rows;

an even row transmission sub pattern part including transmission blocks in even-numbered rows and blocking blocks in odd-numbered rows;

a transmission increasing sub pattern part, wherein the number of the transmission blocks is increased as a distance from a side of the mask in the longitudinal direction is increased;

a transmission decreasing sub pattern part, wherein the number of the transmission blocks is decreased as a distance from a side of the mask in the longitudinal direction is increased;

a whole transmission sub pattern part only including transmission blocks; and a whole blocking sub pattern part only including blocking blocks.

17. The mask of claim 16, wherein the sub pattern parts of the first pattern part comprise a combination of at least one of the odd row transmission sub pattern part, the even row transmission sub pattern part, the transmission increasing sub pattern part, the transmission decreasing sub pattern part, the whole transmission sub pattern part, and the whole blocking sub pattern part, and wherein the sub pattern parts of the second pattern part comprise a combination of at least one of the even row transmission sub pattern part, the odd row transmission sub pattern part, the transmission decreasing sub pattern part, the transmission increasing sub pattern part, the whole blocking sub pattern part, and the whole transmission sub pattern part, wherein the combination of the sub pattern parts of the second pattern part is opposite to the combination of the sub pattern parts of the first pattern part.

18. A mask, comprising:

a first pattern part, a second pattern part, and a third pattern part arranged in a longitudinal direction, each of the first, second, and third pattern parts including a plurality of unit blocks transmitting a portion of light and blocking a portion of the light to selectively crystallize silicon, wherein the first pattern part has a substantially opposite pattern to the third pattern part with respect to the second pattern part.

19. The mask of claim 18, wherein the unit blocks comprise a plurality of transmission blocks transmitting a portion of light, and a plurality of blocking blocks blocking a portion of the light.

20. The mask of claim 19, wherein each of the transmission blocks comprises a plurality of slits.

21. The mask of claim 18, wherein one of the first and third pattern parts comprises a plurality of rows, the transmission blocks being on odd-numbered rows and the blocking blocks being on even-numbered rows, and further wherein the other of the first and third pattern parts comprises a plurality of rows, the blocking blocks being on odd-numbered rows and the transmission blocks being on even-numbered rows.

22. The mask of claim 18, wherein the number of the transmission blocks of one of the first and third pattern parts is increased, as a distance from the second pattern part in the longitudinal direction is increased, and further wherein the number of the transmission blocks of the other of the first and third pattern parts is decreased, as a distance from the second pattern part in the longitudinal direction is increased.

23. The mask of claim 18, wherein the second pattern part comprises a plurality of rows only including transmission blocks.

* * * * *